US008810773B2

(12) United States Patent
Akhssay

(10) Patent No.: US 8,810,773 B2
(45) Date of Patent: Aug. 19, 2014

(54) LITHOGRAPHIC METHOD AND APPARATUS

(75) Inventor: M'hamed Akhssay, Helmond (NL)

(73) Assignee: ASML Netherlands B.V., Veldhoven (NL)

(*) Notice: Subject to any disclaimer, the term of this patent is extended or adjusted under 35 U.S.C. 154(b) by 260 days.

(21) Appl. No.: 12/947,570

(22) Filed: Nov. 16, 2010

(65) Prior Publication Data

US 2011/0116065 A1 May 19, 2011

Related U.S. Application Data

(60) Provisional application No. 61/261,403, filed on Nov. 16, 2009.

(51) Int. Cl.
*G03B 27/52* (2006.01)
*G03F 7/20* (2006.01)

(52) U.S. Cl.
CPC ........ *G03F 7/70308* (2013.01); *G03F 7/70266* (2013.01); *G03F 7/705* (2013.01); *G03F 7/70891* (2013.01)
USPC ................................. 355/55; 355/30; 355/77

(58) Field of Classification Search
CPC . G03F 7/70491; G03F 7/705; G03F 7/70308; G03F 7/70883; G03F 7/70891; G03F 7/70258; G03F 7/70266
USPC .................................... 355/30, 53, 55, 67, 77
See application file for complete search history.

(56) References Cited

U.S. PATENT DOCUMENTS 6,342,941 B1 * 1/2002 Nei et al. ........................ 355/52
6,466,382 B2 * 10/2002 Muller-Rissmann et al. ............................ 359/820
6,521,877 B1 * 2/2003 Muller-Rissmann et al. .......................... 250/201.1
7,221,430 B2 * 5/2007 Van Dijck et al. .............. 355/30
7,525,640 B2 4/2009 Jansen et al.
7,715,107 B2 * 5/2010 Loopstra et al. .............. 359/666
2001/0006412 A1 * 7/2001 Karl-Heinz et al. ............ 355/30
2001/0019403 A1 * 9/2001 Schuster et al. ................ 355/67

(Continued)

FOREIGN PATENT DOCUMENTS

CN 101178547 5/2008
JP 2001-076993 3/2001

(Continued)

OTHER PUBLICATIONS

Korean Office Action dated Jan. 31, 2012 in corresponding Korean Patent Application No. 10-2010-0113383.
Japanese Office Action mailed Apr. 17, 2012 in corresponding Japanese Patent Application No. 2010-250365.

*Primary Examiner* — Steven H Whitesell Gordon
(74) *Attorney, Agent, or Firm* — Pillsbury Winthrop Shaw Pittman LLP

(57) ABSTRACT

A lithographic method includes controlling a phase adjuster of a lithographic apparatus, the phase adjuster being constructed and arranged to adjust a phase of an electric field of a radiation beam traversing an optical element of the phase adjuster, and controlling a signal provided to the phase adjuster that results in an actual time-temperature characteristic of a portion of the optical element, the control being undertaken with reference to a desired time-temperature characteristic of a portion of the optical element, the control of the signal being such that a change in the actual time-temperature characteristic precedes a related change in the desired time-temperature characteristic.

20 Claims, 6 Drawing Sheets

(56) References Cited

U.S. PATENT DOCUMENTS

| | | | | |
|---|---|---|---|---|
| 2006/0008716 | A1* | 1/2006 | Jeunink et al. | 430/30 |
| 2006/0244940 | A1* | 11/2006 | Uehara | 355/69 |
| 2007/0296938 | A1* | 12/2007 | Tel et al. | 355/53 |
| 2008/0123066 | A1* | 5/2008 | Hendricus Jansen et al. | 355/30 |
| 2008/0246933 | A1* | 10/2008 | Uchikawa | 355/52 |
| 2008/0273180 | A1* | 11/2008 | Roux | 355/30 |
| 2011/0116065 | A1* | 5/2011 | Akhssay | 355/67 |

FOREIGN PATENT DOCUMENTS

| | | |
|---|---|---|
| JP | 2007 317 847 A | 12/2007 |
| JP | 2008-118135 | 5/2008 |
| KR | 10-2008-0041583 | 5/2008 |
| KR | 10-2008-0098325 | 11/2008 |

* cited by examiner

LITHOGRAPHIC METHOD AND APPARATUS

CROSS REFERENCE TO RELATED APPLICATIONS

This application claims priority and benefit under 35 U.S.C. §119(e) to U.S. Provisional Patent Application No. 61/261,403, entitled "Lithographic Method and Apparatus", filed on Nov. 16, 2009. The content of that application is incorporated herein in its entirety by reference.

FIELD

The present invention relates to a lithographic method and apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to impart a beam of radiation with a pattern in its cross-section, the pattern corresponding to a circuit pattern to be formed on an individual layer of the IC. This pattern can be imaged or transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an image of the entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the semiconductor manufacturing industry there is increasing demand for ever-smaller features and increased density of features. The critical dimensions (CDs) are rapidly decreasing and are becoming very close to the theoretical resolution limit of state-of-the-art exposure tools such as steppers and scanners as described above. Conventional technologies aimed at enhancing resolution and minimizing printable CD include reducing the wavelength of the exposure radiation, increasing the numerical aperture (NA) of the projection system of the lithographic apparatus, and/or including features in a patterning device pattern smaller than the resolution limit of the exposure tool so that they will not print on the substrate, but so that they will produce diffraction effects which can improve contrast and sharpen fine features.

In order to ensure that patent features applied to a substrate are applied as intended (e.g. to ensure that critical dimension limits, requirements, or uniformities are met), it may be desirable to at least partially correct for aberrations in the lithographic apparatus. Aberrations may arise due to heating of one or more elements of a projection system of the lithographic apparatus which may cause distortion or the like of those one or more elements. Previously, in order to at least partially correct for these aberrations, one or more elements of the projection system (for example, lens elements, or reflective elements) could be moved or reoriented. Movement or reorientation of these elements could be undertaken rapidly, and so the aberrations, even if time varying, could be at least partially corrected for. However, in more recent times it has been suggested to correct for such aberrations by changing the phase of one or more parts of a radiation beam passing through the projection system. The phase may be controlled using a phase adjuster, which may contain an optical element disposed in a lens pupil plane of the projection system. One or more portions of the optical element may be heated in order to change the refractive index of that portion, and thus, in use, adjust the phase of a portion of the radiation beam passing through that portion.

A problem associated with the use of phase adjusters that use heat as the means by which the phase may be controlled is that the rate of change of the applied heating (or cooling) cannot be undertaken at the same rate of change as the aberrations. This means that there is, for example, a significant error between a desired time-temperature characteristic of the portion of the optical element, and a desired time-temperature characteristic of the portion of the optical element. This error can lead to errors in pattern features applied to the substrate (i.e. pattern features not being applied as intended).

SUMMARY

It is desirable to provide, for example, a lithographic method and/or apparatus which obviates or mitigates at least one problem of the prior art, whether identified herein or elsewhere, or which provides an alternative to an existing lithographic method or apparatus.

According to an aspect of the invention, there is provided a lithographic method including controlling a phase adjuster of a lithographic apparatus, the phase adjuster being constructed and arranged to adjust a phase of an electric field of a radiation beam traversing an optical element of the phase adjuster (e.g. disposed in a path of the radiation beam as it passes or would pass through the lithographic apparatus), the method including: controlling a signal provided to the phase adjuster that results in an actual time-temperature characteristic of a portion of the optical element, the control of the signal being such that a change in the actual time-temperature characteristic precedes a related change in a desired time-temperature characteristic of the portion of the optical element.

The optical element may be disposed in or near to a pupil plane of the lithographic apparatus, for example a pupil plane of a projection system.

The control is undertaken with reference to a desired time-temperature characteristic of a portion of the optical element. Reference to the desired time-temperature characteristic of the portion of the optical element may include referring to a desired time-temperature characteristic of a portion of the optical element at a future time in that desired time-temperature characteristic. This 'reference' may alternatively or additionally be described as the controlling of the signal provided to the phase adjuster that results in the actual time-temperature characteristic including using information at least related to the desired time-temperature characteristic at a future time in that desired time-temperature characteristic.

The change in the desired and/or actual time-temperature characteristic may be a change in a gradient of the desired time-temperature characteristic, from a positive gradient to a negative gradient, or from a negative gradient to a positive gradient, or from a zero gradient to a negative gradient, or from a zero gradient to a positive gradient. The change in the gradient of the desired time-temperature characteristic and the related and preceding change in the actual time characteristic may both be changes in the same direction or sense, for example from a positive gradient to a negative gradient, or from a negative gradient to a positive gradient, or from a zero gradient to a negative gradient, or from a zero gradient to a positive gradient. The change in the gradient of the actual time-temperature characteristic may be a consequence or a result of a transition from heating to cooling of the portion of the optical element, or of a transition from cooling to heating of the portion of the optical element.

The change in the desired time-temperature characteristic may be related to a change in temperature of (e.g. one more elements of) a projection system of the lithographic apparatus. The change in temperature of the projection system may be caused by a radiation beam traversing (e.g. one more elements of) the projection system. The change in temperature of (e.g. one more elements of) the projection system may be caused by a change in the state of the lithographic apparatus, from an idle state to an operating state. The change in temperature of (e.g. one more elements of) the projection system may be caused by a change in dose and/or distribution of a radiation beam traversing (e.g. one more elements of) the projection system. The signal provided to the phase adjuster may at least partially correct for one or more aberrations in (e.g. one more elements of) the projection system caused by the change in temperature of the projection system. The one or more elements of the projections system may be or include the optical element of the phase adjuster.

The signal provided to the phase adjuster may result in (e.g. passive or active) heating or cooling of the portion of the optical element.

The method may include controlling one or more signals provided to the phase adjuster that results in an actual time-temperature characteristic for each of one or more portions of the optical element.

According to another aspect of the invention, there is provided a lithographic apparatus including: an illumination system configured to condition a radiation beam; a patterning device support configured to support a patterning device, the patterning device configured to impart the radiation beam with a pattern in its cross-section; a substrate holder configured to hold a substrate; a projection system configured to project the patterned radiation beam onto a target portion of the substrate, a phase adjuster constructed and arranged to adjust a phase of an electric field of a radiation beam traversing an optical element of the phase adjuster (e.g. disposed in a path of the radiation beam as it passes or would pass through the lithographic apparatus); and a controller constructed and arranged to, in use, control a signal provided to the phase adjuster that results in an actual time-temperature characteristic of a portion of the optical element, the control of the signal being such that a change in the actual time-temperature characteristic precedes a related change in a desired time-temperature characteristic of the portion of the optical element.

The optical element may be disposed in or near to a pupil plane of the lithographic apparatus, for example a pupil plane of a projection system.

The controller may be one or more of: provided with information related to the desired time-temperature characteristic of the portion of the optical element; and/or constructed and arranged to receive information related to the desired time-temperature characteristic of the portion of the optical element; and/or constructed and arranged to retrieve information related to the desired time-temperature characteristic of the portion of the optical element.

The controller may be constructed and arranged to use the information related to the desired time-temperature characteristic of the portion of the optical element to control the signal provided to the phase adjuster.

The information related to the desired time-temperature characteristic of the portion of the optical element may include of information related to a desired time-temperature characteristic at a future time in that desired time-temperature characteristic.

The optical element may include of a plurality of controllable portions. Each portion may be provided with a heating wire or other heating element.

The phase adjuster may include of one or more lasers configured to provide infrared radiation that, in use, is directed or directable onto the portion of the optical element. The phase adjuster may be provided with a guide or a guiding arrangement for guiding infrared radiation onto one or more portions of the optical element.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
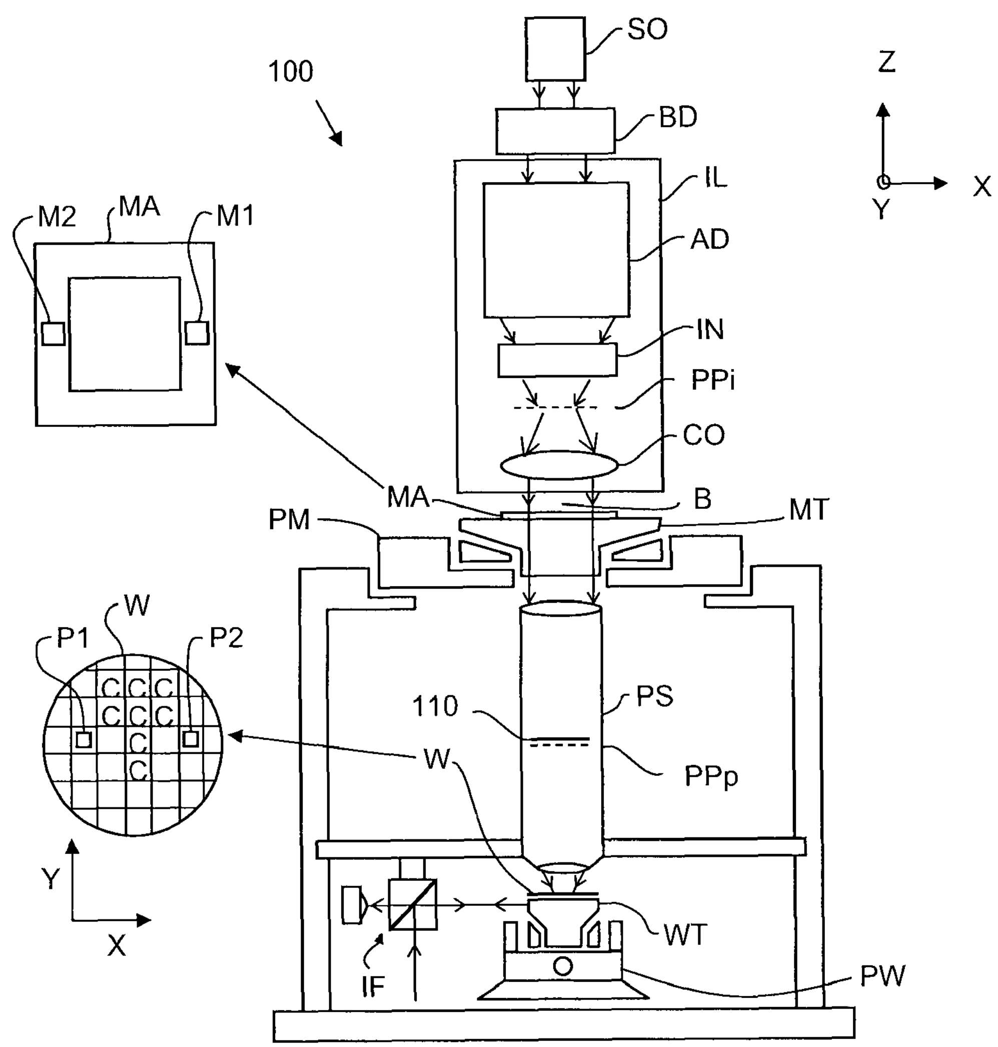
FIG. 1 schematically depicts a lithographic apparatus according to an embodiment of the invention.

FIG. 1 schematically depicts a lithographic apparatus 100 according to an embodiment of the invention. The apparatus 100 includes:

- an illumination system (illuminator) IL configured to condition a radiation beam B (e.g. UV radiation, for example generated by an excimer laser operating at a wavelength of 248 nm or 193 nm, or EUV radiation, for example generated by a laser-fired plasma source operating at about 13.6 nm wavelength);

a patterning device support or support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support MT holds the patterning device. It holds the patterning device in a manner that depends on the orientation of the patterning device, the design of the lithographic apparatus, and other conditions, such as for example whether or not the patterning device is held in a vacuum environment. The patterning device support MT can use mechanical, vacuum, electrostatic or other clamping techniques to hold the patterning device. The patterning device support MT may be a frame or a table, for example, which may be fixed or movable as required. The patterning device support MT may ensure that the patterning device is at a desired position, for example with respect to the projection system. Any use of the terms “reticle” or “mask” herein may be considered synonymous with the more general term “patterning device.”

The term “patterning device” used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term “projection system” used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term “projection lens” herein may be considered as synonymous with the more general term “projection system”.

As here depicted, the apparatus 100 is of a transmissive type (e.g. employing a transmissive mask). Alternatively, the apparatus may be of a reflective type (e.g. employing a programmable mirror array of a type as referred to above, or employing a reflective mask).

The lithographic apparatus 100 may be of a type having two (dual stage) or more substrate tables (and/or two or more patterning device tables). In such “multiple stage” machines the additional tables may be used in parallel, or preparatory steps may be carried out on one or more tables while one or more other tables are being used for exposure.

The lithographic apparatus 100 may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques are well known in the art for increasing the numerical aperture of projection systems. The term “immersion” as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane $PP_i$ of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus 100 could be used in at least one of the following modes:

In step mode, the patterning device support MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the patterning device support MT and the substrate table WT are scanned synchronously while a pattern imparted to the radiation beam is projected onto a target portion C (i.e. a single dynamic exposure). The velocity and direction of the substrate table WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The optical arrangement of the apparatus of FIG. 1 uses Koehler illumination. With Koehler illumination, a pupil plane $PP_i$ in the illumination system IL is conjugate to a pupil plane $PP_p$ of the projection system PS. The pupil plane $PP_p$ is a Fourier transform plane of the object plane in which the patterning device MA is located. As is conventional, an illumination mode of this apparatus can be described by reference to the distribution of intensity of the radiation of the beam B in the pupil plane PP; of the illumination system. The distribution of intensity in the pupil plane $PP_p$ of the projection system PS will be substantially the same as the distribution of intensity in the pupil plane $PP_i$ of the illumination system, subject to diffraction effects of the pattern of the patterning device MA.

The projection system PS includes a phase adjuster 110 constructed and arranged to adjust a phase of an electric field of an optical radiation beam traversing the projection system.

Figure 2:
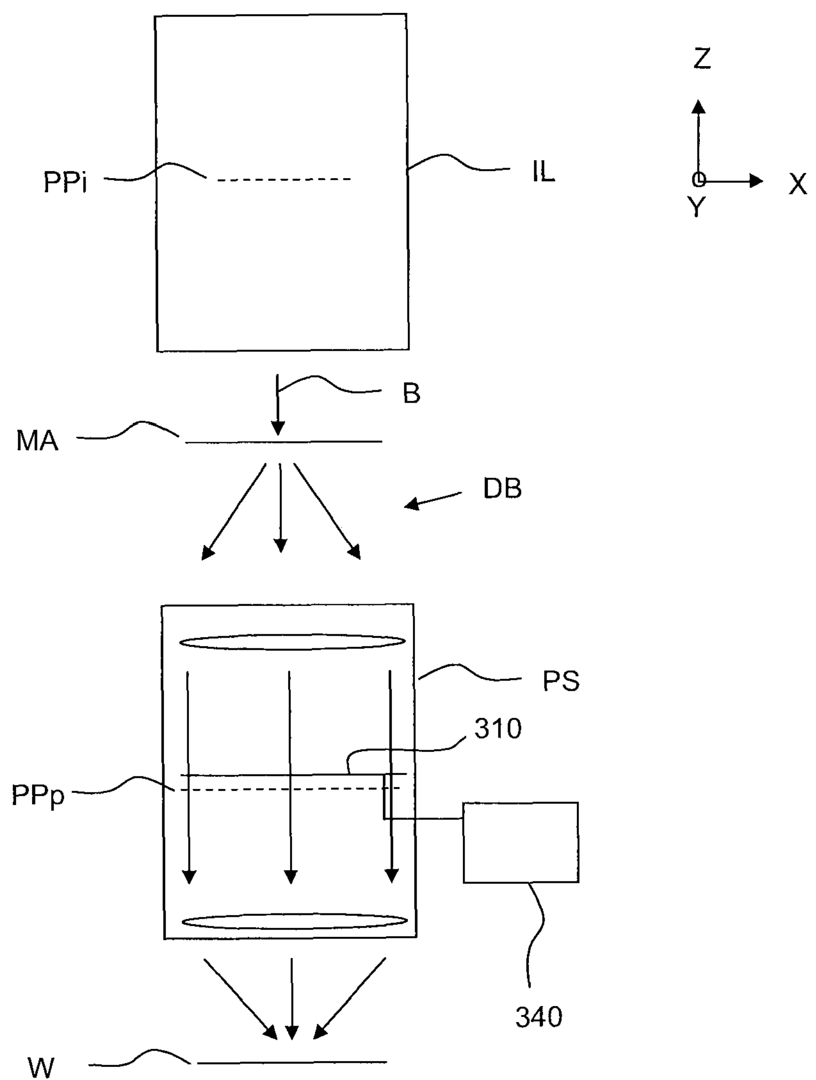
FIG. 2 schematically depicts a phase adjuster configured to change a phase of an electromagnetic wave traversing a projection system of the lithographic apparatus.

As schematically shown in FIG. 2, the phase adjuster 110 may include an optical element 310 of a material substantially transmissive for radiation of the beam 13. In another embodiment, the optical element 310 may be reflective for radiation of the beam B. The phase adjuster 110 may further include a controller 340. An optical path length for a wave traversing the element 310 is adjustable in response to a signal supplied by controller 340. The optical element 310 may be disposed or disposable, for example, substantially in a Fourier Transform plane such as the pupil $PP_p$, and such that, in use, it is traversed by diffracted beams DB emanating from the patterning device.

Figure 3:
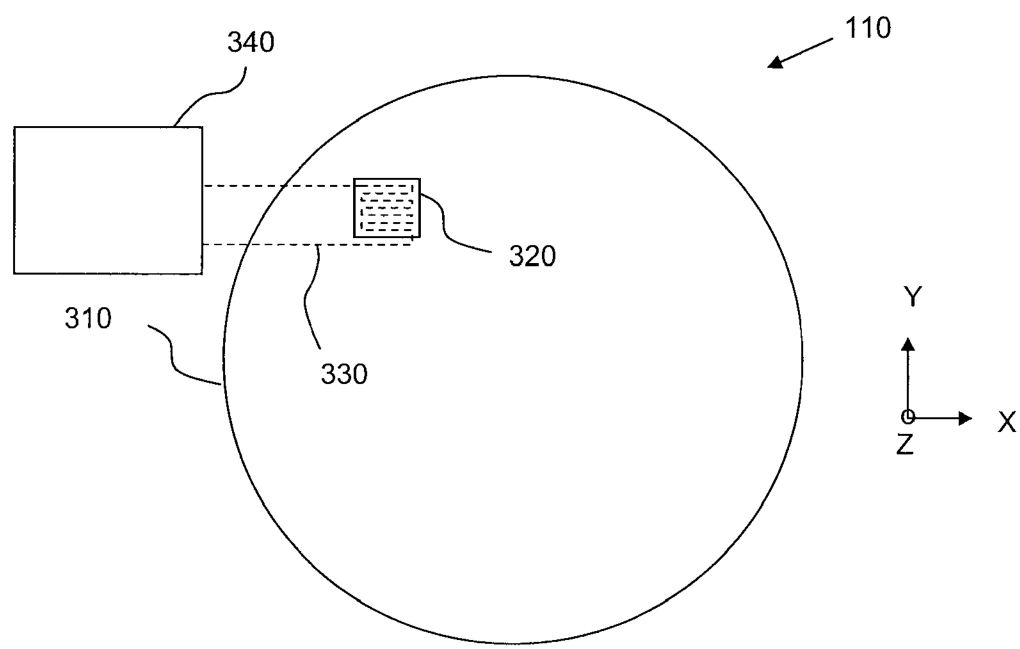
FIG. 3 schematically depicts an optical element included in the phase adjuster.

FIG. 3 illustrates the phase adjuster 110 in more detail, and shows a top view, along the Z-axis, of the optical element 310. An adjustment of a phase of an optical wave traversing the element 310 may be obtained by applying heat to (i.e. heating), or removing heat from (i.e. cooling), a portion 320 of the optical element 310, thereby introducing a local change of index of refraction of the material of the element relative to the refractive index of the material adjacent to the portion 320. The application of heat can be realized by, for example, transmitting an electrical current through a wire 330 having Ohmic resistance and being arranged in contact with the portion 320 of the element and with the controller 340 arranged to provide the current to the wire 330.

Figure 4:
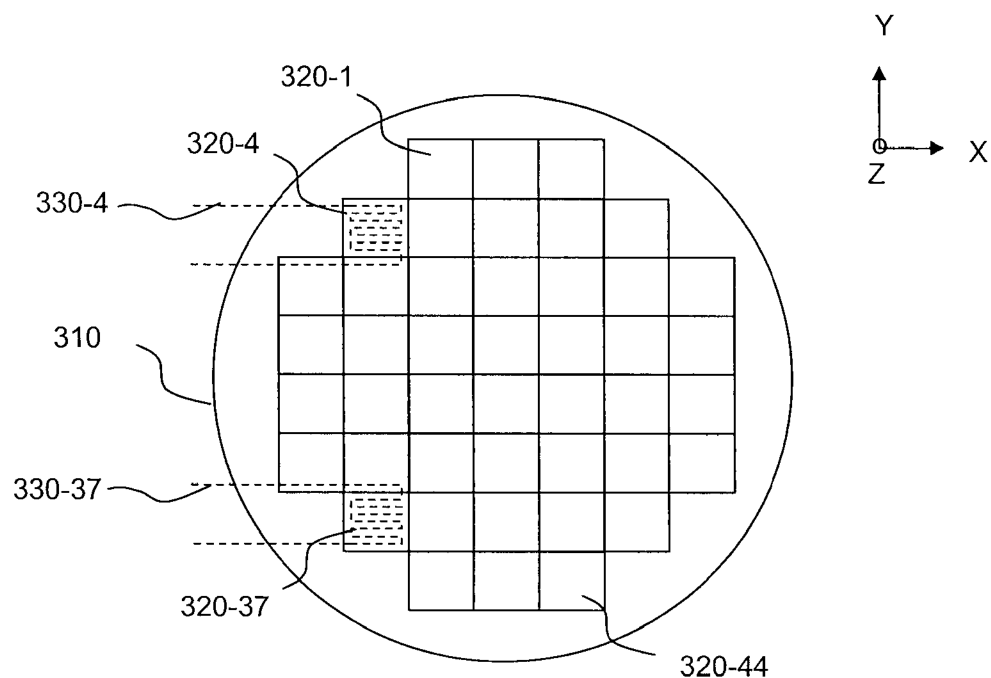
FIG. 4 schematically depicts temperature controllable portions of the optical element included in the phase adjuster.

A plurality of adjacent portions of the optical element may be provided with a corresponding plurality of wires for heating any portion independently from any other portion. For example, as schematically illustrated in FIG. 4, adjacent portions 320-1 up to 320-44 are disposed in adjacent rows and numbered from left to right and from top to bottom. Each portion 320 of the portions 320-1 up to 320-44 is provided with correspondingly numbered heating wires 330-1 up to 330-44 (although FIG. 4, merely for clarity sake, illustrates this only for the portions 320-4 and 320-37). The controller 340 is constructed and arranged such that each wire can be current-activated independently. This enables application of a spatial phase distribution to an optical wave traversing the element 310, in accordance with a spatial distribution of the temperature over the element 310 in the X,Y plane.

In addition or alternatively, the optical element 310 may include one or more channels arranged to contain a cooling fluid. The phase adjuster 110 may include a cooling fluid supply and retrieval system connected to the one or more channels and arranged to circulate cooling fluid at a controlled temperature through the one or more channels. Like the wires 330, a cooling channel may be associated with each portion 320; however, alternatively a single cooling channel may be arranged for all portions 320. A cooling of the element 310 in combination with heating a portion 320 of the element 310 may enable adjusting the temperature of the portion 320 within a range of temperatures extending both below and above a nominal temperature. The nominal temperature may, for example, be a specified desired operating temperature of the apparatus 100 or of the material of the optical elements of the projection system PS.

Embodiments of a phase adjuster 110 can be gleaned from U.S. patent application Ser. No. 11/593,648. A total number of portions 320 is not limited to 44. Instead a total number may in general depend on a desired spatial resolution of temperature distributions. For example, a ratio of the area of each of the portions 320 to the size of a clear area in the pupil plane PPi of the projection system PS may be between 100 and 1000.

Figure 5:
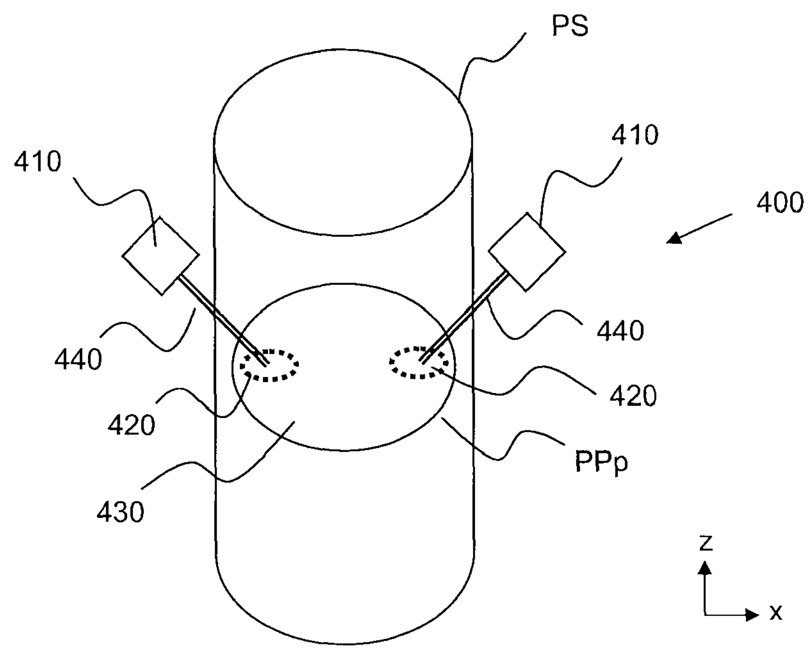
FIG. 5 schematically depicts a phase adjuster according to another embodiment of the present invention.

It is noted that the invention is not limited to the specific embodiment, described above, of the phase adjuster 110. Such an embodiment is presented herein for illustrative purposes only. Additional embodiments will be apparent to persons skilled in the relevant art(s) based on the teachings contained herein. For example, FIG. 5 discloses an alternative embodiment of a phase adjuster 400. The alternative phase adjuster 400 may include one or more infrared lasers 410 arranged to selectively heat portions 420 of an optical element 430 disposed in a (lens) pupil plane $PP_p$ of the projection system PS. Infrared radiation 440 may be guided to selected portions 420 of the optical element 430 by means of, for example, one or more hollow optical fibers, lenses, reflective elements or by appropriate orientation of the one or more infrared lasers 410. Further details of this embodiment can be gleaned from Japan patent application publication JP 2007317847 A. In the absence of cooler, temperatures of different portions 420 can be arranged to mutually differ from each other by supplying corresponding mutually different amounts of infrared radiation energy 440 to the corresponding different portions 420. A nominal temperature may then be specified as, for example, the average temperature value of the mutually different temperatures. In another embodiment, a radiation source other than a laser may be used to provide radiation for heating the optical element. The radiation may be radiation other than infrared radiation, and may be for example UV or DUV radiation.

A phase adjuster as described above may be used to, for example, at least partially correct for aberrations in the projection system, which may for example be caused by changes in temperature of the projection system. The change in temperature of the projection system may be caused by a radiation beam traversing the projection system. For instance, the change in temperature may be or may result from a change in the state of the lithographic apparatus, from an idle state to an operating state, i.e. from a state when there is no radiation being traversing the projection system, to a state where a radiation beam is traversing the projection system. Alternatively or additionally, a change in temperature of the projection system may be caused by a change in dose and/or distribution (e.g. an angular or intensity distribution) of radiation traversing in the projection system. Such changes may result due to different patterns being applied to the substrate, or from changes in properties of the radiation beam used to apply the same or different patterns to different areas of a substrate. Alternatively or additionally, the change in temperature may be caused between exposures of different areas (e.g. dies or target portions) of the substrate, or by the exposure of different substrates.

Figure 6:
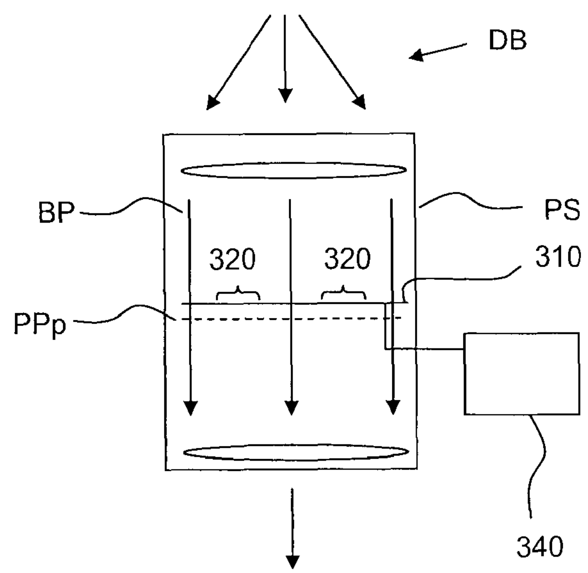
FIG. 6 schematically depicts a phase adjuster configured to change a phase of an electromagnetic wave traversing a projection system of the lithographic apparatus, with reference to specific portions of an optical element of the phase adjuster.

In order to take into account and at least partially compensate for changes in temperature of the projection system (which may involve changes in temperature of one or more elements of the projection system), and the resulting aberrations, a model may be established. The model may be used to predict or provide a desired time-temperature characteristic of one or more portions of the optical element of the phase adjuster that will be required to at least partially correct for the aberrations in the projection system. For example, FIG. 6 shows how a controller 340 can provide a signal to the phase adjuster that includes optical element 310, in order to control the time-temperature characteristic of one or more portions 320 of the optical element.

Figure 7:
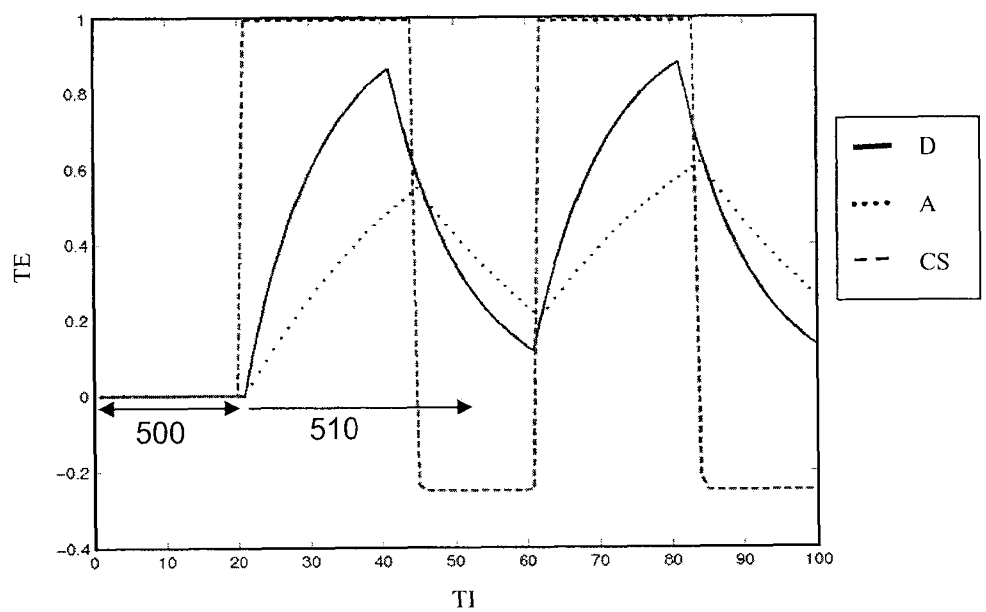
FIG. 7 is a graph schematically depicting a desired time-temperature characteristic of a portion of an optical element of a phase adjuster, together with an actual time-temperature characteristic of the portion of the optical element, and also a control signal applied to the phase adjuster that results in the actual time-temperature characteristic.

FIG. 7 schematically depicts a graph having a plot of a desired time (TI)-temperature (TE) characteristic D for, for example, a portion of an optical element as described above. This desired time-temperature characteristic D can be determined from modeling or the like. The temperature TE is provided in arbitrary units in FIGS. 7 and 8. The time TI is provided in units of minutes in FIGS. 7, 8 and 9.

For a first period of time 500 the desired time-temperature characteristic D has no gradient, which means that during this period 500 there is no desire or intention to heat or cool the portion of the optical element. This period 500 may, for example, correspond to a situation when the lithographic apparatus is idle and no radiation beam is passing through the projection system of the apparatus, and thus there are no heat induced aberrations in the projection system that need to be corrected for.

After this first period 500, there is a second period 510 which corresponds to a period during which the lithographic apparatus is operating. During this period 510, a radiation beam may traverse the projection system of the lithographic apparatus, thereby heating up the projection system and causing aberrations which need to be corrected for. These aberrations may be corrected by, for example, appropriate heating of a portion (or portions) of the optical element. During this period 510, the desired time-temperature characteristic D appropriately and periodically increases or decreases. The period and magnitude of the changes in the characteristic D may relate to a period and magnitude of changes in temperature of the projection system.

In order to be able to achieve an actual time-temperature characteristic A, a control signal CS is provided to the phase adjuster which results in the controlling of the actual temperature TE of the portion of the optical element over time TI. From FIG. 7, it can be seen that this actual time-temperature characteristic A does not match the desired time-temperature characteristic D—i.e. there is an error between the characteristics. This can be for one of a number of reasons, but is usually associated with hardware limitations in the phase adjuster. For example, a time constant associated with the heating of the projection system of the lithographic apparatus, which will correspond with the time constant of the rate of change of the desired time-temperature characteristic D, might be lower than the time constant of the phase adjuster. This might mean that temperature change of the phase adjuster cannot match (i.e. keep up with) the temperature change of the projection system. Alternatively or additionally, the phase adjuster may have operating limits which are lower than desired operating limits specified by the desired time-temperature characteristic D. For example, the phase adjuster may not be able to reach or achieve a certain high or low temperature, demanded by the (e.g. modeled) desired time-temperature characteristic D.

Because the actual time-temperature characteristic A does not match the desired time-temperature characteristic D, aberrations in the projection system cannot be corrected for in a desirable manner. It is desirable, therefore, to be able to improve the control of a phase adjuster such that the actual time-temperature characteristic A of a portion of an optical element of the phase adjuster (or one or more portions) more closely matches or resembles a desired time-temperature characteristic D for that portion (or those portions).

According to an embodiment of the present invention, one or more problems associated with conventional control of a phase adjuster can be obviated or mitigated. According to an embodiment of the present invention, there is provided a lithographic method including controlling a phase adjuster of a lithographic apparatus. The phase adjuster is constructed and arranged to adjust a phase of an electrical field of a radiation beam traversing an optical element of the phase adjuster, that optical element being disposed in a pupil plane of a projection system of that lithographic apparatus (see, for example, the embodiments described above). The method includes controlling a signal provided to the phase adjuster that results in an actual time-temperature characteristic of or for a portion of the optical element. The control is undertaken with reference to a desired time-temperature characteristic of a portion of the optical element. In contrast to existing control methods, in accordance with an embodiment of the present invention, the control of the signal is such that a change in the actual time-temperature characteristic precedes a related change in the desired time-temperature characteristic.

As discussed above, a difference in the time constant between a desired heating rate of a portion of the optical element and an actual heating rate of the portion of the optical element can result in a significant error between the actual and desired time-temperature characteristics, and thus a poor correction of an aberration caused by heating of the projection system. By making a change in the actual time-temperature characteristic of the portion of the optical element prior to a related change in the desired time-temperature characteristic, the differences in time constants (and/or other hardware limitations) may be at least partially taken into account or compensated for. This may result in, for example, the average error between a desired and actual time-temperature characteristic being reduced, or a maximum error between the characteristics being reduced.

Reference to the desired time-temperature characteristic that is required to provide the actual time-temperature characteristic may include referring to the desired time-temperature characteristic at a future time in that desired characteristic. This may alternatively or additionally be described as the method including controlling the signal provided to the phase adjuster that results in the actual time-temperature characteristic by using information at least related to the desired time-temperature characteristic at a future time in that desired time-temperature characteristic. This means that, for example, any changes in the desired time-temperature characteristic can be seen and acted upon in advance, thus leaving adequate time for the actual time-temperature characteristic to be changed. For example, the actual time-temperature characteristic may be established by looking ahead by 10, 20, 30, 40, 50, 60 or more minutes in advance in the desired time-temperature characteristic, depending upon the time constant (and/or any other hardware performance values) of the phase adjuster that is being used to control the temperature of the optical element.

The changes referred to above may be changes in gradient of the desired time-temperature characteristic and/or the actual time-temperature characteristic of the portion of the optical element. The changes are likely to be significant, for example from a positive gradient to a negative gradient, or from a negative gradient to a positive gradient, or from a zero gradient to a negative gradient, or from a zero gradient to a positive gradient. Furthermore, the change in the gradient of the desired time-temperature characteristic, and the preceding change in the actual time-temperature characteristic are likely to be in the same direction, or sense. This means that the change in the desired time-temperature characteristic and the preceding change in the actual time-temperature characteristic will both be changes from a positive gradient to a negative gradient, or from a negative gradient to a positive gradient, or from a zero gradient to a negative gradient, or from a zero gradient to a positive gradient. Changes in the gradient of the time-temperature characteristics may be consequences of a transition from a heating to a cooling of the portion of the optical element, or a transition from cooling to heating of the portion of the optical element. The heating or cooling may be active or passive. For instance, the portion of the optical element may be heated by a heater to increase its temperature, and cooled by passing a cooling fluid or the like through or past the portion to reduce its temperature. This may be referred to as active heating and cooling. In another example, the heating of the portion or the cooling of the portion may be stopped and the temperature of the portion allowed to reach an equilibrium level. This, for example, may be interpreted as passive cooling or heating, respectively.

From the above, it may be understood that a desired time-temperature characteristic may be proportional to (e.g. in general shape or the like) the actual time-temperature characteristic. For example, the shape of the actual time-temperature characteristic may in many ways resemble the shape of the desired time-temperature characteristic, although the actual time-temperature characteristic may, for example, be slightly offset such that changes in gradient as discussed above may occur earlier in time than the desired time-temperature characteristic.

As discussed above in relation to embodiments of a phase adjuster, controlling the temperature of a portion of an optical element may result in a corresponding control of a refractive index of that portion of the optical element. Thus, the time-temperature characteristics referred to above and below may alternatively or additionally be described, or be interpreted as, time-refractive index characteristics.

A specific embodiment of the present invention will now be described with reference to FIGS. 8 and 9.

Figure 8:
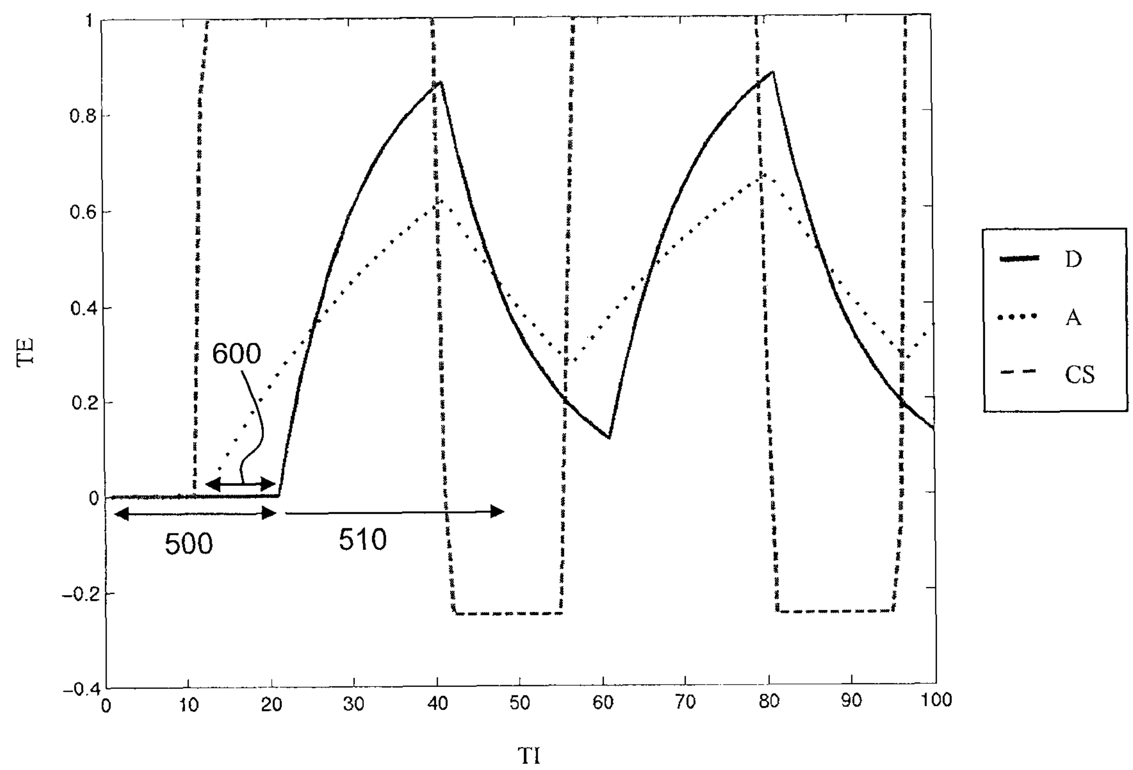
FIG. 8 is a graph schematically depicting a desired time-temperature characteristic of a portion of an optical element of a phase adjuster, together with an actual time-temperature characteristic of the portion of the optical element, and also a control signal applied to the phase adjuster that results in the actual time-temperature characteristic, according to an embodiment of the present invention.

FIG. 8 is a graph schematically depicting a desired time-temperature characteristic D of a portion of the optical element of the phase adjuster. The desired time-temperature characteristic D is the same as the desired time-temperature characteristic shown in and described in reference to FIG. 7.

Reference is now made to FIGS. 7 and 8 in combination. In FIG. 8 a control signal provided to the phase adjuster is provided earlier 600 than it is in FIG. 7. The earlier provision 600 of the control signal (or, specifically a “high” or “on” control signal) ensures that the actual time-temperature characteristic A changes from a zero gradient to a positive gradient at an earlier time in FIG. 8 than in FIG. 7. In FIG. 8, this means that the change in gradient of the actual time-temperature characteristic A precedes the related change in the gradient of the desired time-temperature characteristic D.

When the lithographic apparatus is in operation for the period 510 after the idle period 500, changes in the gradient of the actual time-temperature characteristic A (e.g. changes from positive to negative gradient or negative to positive gradient, and the like) again precede related changes in the desired time-temperature characteristic D. This is achieved by appropriate timing of changes in the control signal CS, which changes also precede abrupt changes in gradient in the desired time-temperature characteristic D (i.e. from a positive gradient to a negative gradient, or from a negative gradient to a positive gradient, or from a zero gradient to a negative gradient, or from a zero gradient to a positive gradient). This is in stark contrast to the conventional control regime shown in FIG. 7, where the changes in gradient of the actual time-temperature characteristic A coincide with or occur after related changes in the desired time-temperature characteristic D. FIG. 9 schematically depicts the benefits associated with the approach shown in and described with reference to FIG. 8.

Figure 9:
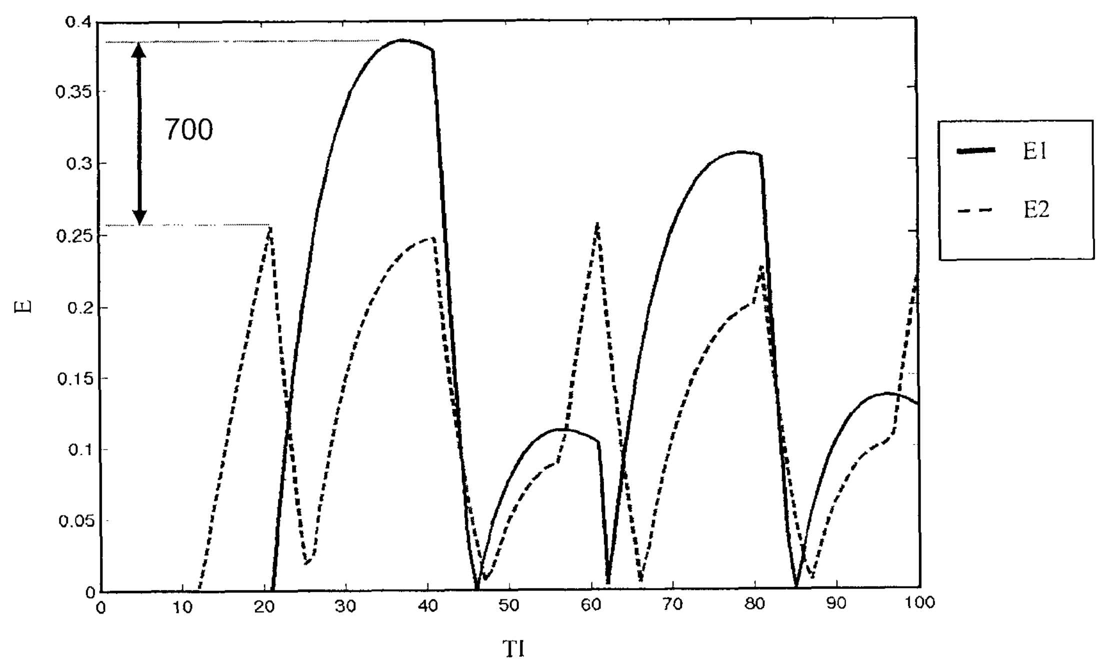
FIG. 9 is a graph schematically depicting an error between the desired and actual time-temperature characteristics of FIG. 7, together with the error between the desired and actual time-temperature characteristics of FIG. 8.

FIG. 9 is a graph schematically depicting an error E1 between a desired time-temperature characteristic and an actual time-temperature characteristic according to the conventional control shown in and described with reference to FIG. 7, and also an error E2 between a desired time-temperature characteristic and an actual time-temperature characteristic using the control method according to an embodiment of the present invention, as depicted in FIG. 8. Error E is provided in arbitrary units in FIG. 9.

FIG. 9 illustrates that there are still errors E2 associated with the use of a control method according to an embodiment of the present invention, and that at some times the associated error E2 is greater than the error would be with conventional control E1 of the phase adjuster. However, what is sometimes or often important to end users of a lithographic apparatus is not the change in error between new and existing control methods, but the absolute reduction in maximum error (if applicable) between a new and existing method. This is because it is these maximum or extreme errors which need to be taken into account when building in tolerances into the operation of the lithographic apparatus, or the specifications for pattern features, devices or the like provided or manufactured using that apparatus. FIG. 9 shows that, using the control method according to an embodiment of the present invention, the maximum control error 700 is reduced by around 30% in comparison with conventional control, which is clearly a significant reduction.

As discussed above, changes in, for example, the gradient of the actual time-temperature characteristic precede related changes in the gradient of the desired time-temperature characteristic. The time between the changing of the gradient of the actual time-temperature characteristic and the changing of the gradient of the desired time-temperature characteristic may depend on many factors, for example the duration over which the projection system is being heated, the rate of heating, the maximum temperature or heat supplied, and the like. The control method, or a controller implementing that method, can take these factors into account (e.g. using a model or the like) in determining the timing of changes in gradient of the actual time-temperature characteristic, for example by looking ahead (e.g. at a future time) at or in the desired time-temperature characteristic to determine the required timing of the change in gradient. For example, for the period over which the controller or control method looks ahead to determine the required changes in gradient, the control method or controller may be configured to take into account operational limits of the phase adjuster (e.g. maximum temperature, minimum temperature, time constants, rate of heat supply or rate of heat withdrawal and the like) and, using these factors, determine a gradient which will result in a reduced or minimum error between the desired and actual time-temperature characteristic over that time period (or in other words, time window).

According to another but related, embodiment of the present invention, there is provided a lithographic apparatus capable of carrying out the control method described above. The apparatus includes an illumination system for conditioning a radiation beam. The apparatus further includes a patterning device for imparting the radiation beam with a pattern in its cross section. A substrate holder is also provided for holding a substrate. The apparatus further includes a projection system for projecting the patterned radiation beam onto a target portion of the substrate. Further provided is a phase adjuster (for example a phase adjuster as described in any one or more of the embodiments described above) for adjusting a phase of an electric field of a radiation beam traversing an optical element of the phase adjuster. The optical element is disposed in a pupil plan on the projection system. A controller constructed and arranged to, in use, control a signal provided to the phase adjuster is also provided. The signal the controller provides results in an actual time-temperature characteristic of or for a portion of the optical element. The control is undertaken with reference to a desired time-temperature characteristic of a portion of the optical element, as described above. The control signal is such that a change in the actual time-temperature characteristic precedes a related change in the desired time-temperature characteristic, as discussed above.

The controller may be a computational device or the like. The signal could take any one of a number of forms. For example, the signal could be an "on" or "off" signal to a heater, or the signal could, by appropriate current flow, contribute to or provide the heating. In another example, the signal may control one or more lasers or guides for radiation beams provided by those lasers, in order to control the amount of radiation that is directed towards one or more portions of the optical element.

The controller may be provided with information related to the desired time-temperature characteristic of the portion of the optical element, for example in a wired or wireless manner (e.g. from computer memory or the like). Alternatively or additionally, the controller may be constructed and arranged to receive information related to the desired time-temperature characteristic of the portion of the optical element, for example in a wired or wireless manner (e.g. from computer memory or the like). Alternatively or additionally, the controller may be constructed and arranged to retrieve information related to the time-temperature characteristic of the portion of the optical element, for example in a wired or wireless manner (e.g. from computer memory or the like). The information related to the desired time-temperature characteristic may be the desired time-temperature characteristic itself in numeric or data form or may be code or the like which is representative of that time-temperature characteristic. The information related to the desired time-temperature characteristic may be or include the entire characteristic, or a portion of the characteristic.

As discussed above, the controller is constructed and arranged (e.g. configured) to use the information related to the desired time-temperature characteristic to control the signal provided to the phase adjuster. The controller may be provided with, or be in connection with, hardware or software which facilitates such use (e.g. hardware or software including a modeling tool or the like). The information related to the desired time-temperature characteristic may include the information related to the desired time-temperature characteristic at a future time in that characteristic. In this way, the controller may look ahead at changes in the desired time-temperature characteristic that are to be made in or to the actual time-temperature characteristic.

The optical element may include one or more controllable portions, for example wherein each portion is provided with a heating wire or other form of heating element. Alternatively or additionally, the phase adjuster may include one or more lasers configured to provide infrared radiation that, in use, is directed or is directable onto one or more portions of the optical element. A guide or guiding arrangement may be provided to guide infrared radiation onto one or more portions of the optical element.

The optical element has been described as being disposed in a pupil plane of the projection system. Locating the optical element in a pupil plane may be beneficial if it not desired to image features of that optical element. The same benefits may also be achieved if the optical element is located near to, and not necessarily disposed in, a pupil plane. If imaging of features of the optical element is not a problem, then the optical element may be disposed in or near to a field plane. In summary, the optical element may be located in the path of the radiation beam used to apply a pattern to a substrate—the location does not need to be near to or coincide with a pupil plane. The location may not be in a projection system, but can be upstream or down stream of the projection system.

The refractive index of one or more portions of the optical element may be used to correct for aberrations, for example aberrations caused by heating or cooling of one or more elements of the projection system, as described above. The optical element of the phase adjuster may be one of the elements, or the element, that is heated or cooled to cause the aberrations. Heating of one or more portions of the optical element of the phase adjuster that is caused by the traversing of the radiation beam of the lithographic apparatus may be corrected for by appropriate heating or cooling of one or more portions (e.g. the same or different portions) of that optical element.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic method comprising:

controlling a phase adjuster of a lithographic apparatus, the phase adjuster being constructed and arranged to adjust a phase of an electric field of a radiation beam traversing an optical element of the phase adjuster using a model that provides a desired time-temperature characteristics of a portion of the optical element that at least partially corrects for aberrations generated by the radiation beam traversing a projection system of the lithographic apparatus; and controlling a signal provided to the phase adjuster that results in an actual time-temperature characteristic of the portion of the optical element, the control of the signal being such that a change in the actual time-temperature characteristic precedes a related change in the desired time-temperature characteristic of the portion of the optical element and the actual time-temperature characteristic of the portion of the optical element more closely matches the desired time-temperature characteristics for that portion of the optical element.

2. The lithographic method of claim 1, wherein controlling the signal provided to the phase adjuster that results in the actual time-temperature characteristic comprises using information at least related to the desired time-temperature characteristic at a future time in that desired time-temperature characteristic.

3. The lithographic method of claim 1, wherein the change in the desired and/or actual time-temperature characteristic is a change in a gradient of the desired time-temperature characteristic, from a positive gradient to a negative gradient, or from a negative gradient to a positive gradient, or from a zero gradient to a negative gradient, or from a zero gradient to a positive gradient.

4. The lithographic method of claim 3, wherein the change in the gradient of the desired time-temperature characteristic and the related and preceding change in the actual time characteristic are both changes from a positive gradient to a negative gradient, or from a negative gradient to a positive gradient, or from a zero gradient to a negative gradient, or from a zero gradient to a positive gradient.

5. The lithographic method of claim 3, wherein the change in the gradient of the actual time-temperature characteristic is a consequence of a transition from heating to cooling of the portion of the optical element, or of a transition from cooling to heating of the portion of the optical element.

6. The lithographic method of claim 1, wherein the change in the desired time-temperature characteristic is related to a change in temperature of a projection system of the lithographic apparatus.

7. The lithographic method of claim 6, wherein the change in temperature of the projection system is caused by a radiation beam traversing the projection system.

8. The lithographic method of claim 6, wherein the change in temperature of the projection system is caused by a change in a state of the lithographic apparatus, from an idle state to an operating state.

9. The lithographic method of claim 6, wherein the change in temperature of the projection system is caused by a change in dose and/or distribution of a radiation beam traversing the projection system.

10. The lithographic method of claim 6, wherein the signal provided to the phase adjuster at least partially corrects for aberrations in the projection system caused by the change in temperature of the projection system.

11. The lithographic method of claim 1, wherein the signal provided to the phase adjuster results in heating or cooling of the portion of the optical element.

12. The lithographic method of claim 1, wherein the method comprises controlling one or more signals provided to the phase adjuster that results in an actual time-temperature characteristic for each of one or more portions of the optical element,

13. A lithographic apparatus comprising:

an illumination system configured to condition a radiation beam;

a patterning device support configured to support a patterning device, the patterning device configured to impart the radiation beam with a pattern in its cross-section to form a patterned radiation beam;

a substrate holder configured to hold a substrate;

a projection system configured to project the patterned radiation beam onto a target portion of the substrate;

a phase adjuster constructed and arranged to adjust a phase of an electric field of the radiation beam traversing an optical element of the phase adjuster using a model that provides a desired time-temperature characteristics of a portion of the optical element that at least partially corrects for aberrations generated by the radiation beam traversing a projection system of the lithographic apparatus; and a controller constructed and arranged to, in use, control a signal provided to the phase adjuster that results in an actual time-temperature characteristic of the portion of the optical element, the control of the signal being such that a change in the actual time-temperature characteristic precedes the related change in a desired time-temperature characteristic of the portion of the optical element and the actual time-temperature characteristic of the portion of the optical element more closely matches the desired time-temperature characteristics for that portion of the optical element.

14. The lithographic apparatus of claim 13, wherein the controller is one or more of:

provided with information related to the desired time-temperature characteristic of the portion of the optical element; and/or constructed and arranged to receive information related to the desired time-temperature characteristic of the portion of the optical element; and/or constructed and arranged to retrieve information related to the desired time-temperature characteristic of the portion of the optical element.

15. The lithographic apparatus of claim 14, wherein the controller is constructed and arranged to use the information related to the desired time-temperature characteristic of the portion of the optical element to control the signal provided to the phase adjuster.

16. The lithographic apparatus of claim 14, wherein the information related to the desired time-temperature characteristic of the portion of the optical element comprises information related to a desired time-temperature characteristic at a future time in that desired time-temperature characteristic,

17. The lithographic apparatus of claim 13, wherein the optical element comprises a plurality of controllable portions.

18. The lithographic apparatus of claim 13, wherein each portion is provided with a heating wire.

19. The lithographic apparatus of claim 13, wherein the phase adjuster comprises a laser configured to provide infrared radiation that, in use, is directed onto the portion of the optical element.

20. The lithographic apparatus of claim 19, wherein the phase adjuster is provided with a guide configured to guide infrared radiation onto one or more portions of the optical element.

* * * * *